United States Patent
Turier et al.

(10) Patent No.: US 8,179,708 B2
(45) Date of Patent: May 15, 2012

(54) ANTI-CROSS-TALK CIRCUITRY FOR ROM ARRAYS

(75) Inventors: Arnaud Turier, Chateauneuf le Rouge (FR); Lotfi B. Ammar, Gardanne (FR)

(73) Assignee: Atmel Corporation, San Jose, CA (US)

( * ) Notice: Subject to any disclaimer, the term of this patent is extended or adjusted under 35 U.S.C. 154(b) by 390 days.

(21) Appl. No.: 12/388,293

(22) Filed: Feb. 18, 2009

(65) Prior Publication Data

US 2010/0208505 A1  Aug. 19, 2010

(51) Int. Cl.
*G11C 17/00* (2006.01)
(52) U.S. Cl. ...... 365/94; 365/203; 365/204; 365/189.06
(58) Field of Classification Search .............. 365/94, 365/203, 204, 189.06
See application file for complete search history.

(56) References Cited

U.S. PATENT DOCUMENTS

| | | | |
|---|---|---|---|
| 4,783,766 A | 11/1988 | Samachisa et al. | |
| 5,287,322 A | 2/1994 | Rastegar | |
| 5,345,416 A | 9/1994 | Nakagawara | |
| 6,018,487 A | 1/2000 | Lee et al. | |
| 6,028,813 A | 2/2000 | Choi | |
| 6,044,033 A | 3/2000 | Jang | |
| 6,442,087 B1 | 8/2002 | Morishima | |
| 6,483,763 B2 | 11/2002 | Uchikoba et al. | |
| 6,487,124 B2 * | 11/2002 | Semi | 365/185.25 |
| 6,493,269 B1 | 12/2002 | Cernea | |
| 6,510,084 B2 | 1/2003 | Ha | |
| 6,710,399 B2 | 3/2004 | Kamei | |
| 6,728,125 B2 | 4/2004 | Hong | |
| 6,738,291 B2 | 5/2004 | Kamei et al. | |
| 6,781,897 B2 | 8/2004 | Dvir et al. | |
| 6,920,059 B2 | 7/2005 | Jacob et al. | |
| 6,990,025 B2 | 1/2006 | Kirihata et al. | |
| 7,085,169 B2 | 8/2006 | Park et al. | |
| 7,289,376 B2 * | 10/2007 | Chang et al. | 365/189.06 |
| 7,518,925 B2 * | 4/2009 | Kuramori | 365/185.18 |
| 2006/0171240 A1 | 8/2006 | Combe | |
| 2008/0130365 A1 | 6/2008 | Combe | |
| 2011/0044114 A1 | 2/2011 | Combe | |

FOREIGN PATENT DOCUMENTS

| | | |
|---|---|---|
| EP | 0318011 A2 | 5/1989 |
| EP | 1422718 A2 | 5/2004 |

OTHER PUBLICATIONS

"U.S. Appl. No. 11/120,894, Non-Final Office Action mailed Apr. 1, 2008", 5 pgs.
"U.S. Appl. No. 11/120,894, Amendment and Response filed Dec. 18, 2008 to Final Office Action mailed Sep. 18, 2008", 11 pgs.
"U.S. Appl. No. 11/120,894, Final Office Action mailed Sep. 18, 2008", 8 pgs.
"U.S. Appl. No. 11/120,894, Non-Final Office Action mailed Feb. 10, 2009", 8 pgs.

(Continued)

*Primary Examiner* — Tuan T Nguyen
*Assistant Examiner* — Toan Le
(74) *Attorney, Agent, or Firm* — Fish & Richardson P.C.

(57) ABSTRACT

A circuit and method precharge a selected bit-line in a read only memory (ROM) array during a precharge period of a read cycle. At least one bit-line adjacent to the selected bit-line is discharged during the precharge period. After the precharge period, the selected bit-line is read such that parasitic capacitance effects on the selected bit-line are reduced.

21 Claims, 8 Drawing Sheets

OTHER PUBLICATIONS

"U.S. Appl. No. 11/120,894, Advisory Action mailed Jan. 8, 2008", 3 pgs.
"U.S. Appl. No. 11/120,894, Advisory Action mailed Apr. 17, 2007", 3 pgs.
"U.S. Appl. No. 11/120,894, Final Office Action mailed Feb. 8, 2007", 5 pgs.
"U.S. Appl. No. 11/120,894, Final Office Action mailed Oct. 19, 2007", 6 pgs.
"U.S. Appl. No. 11/120,894, Non Final Office Action mailed May 15, 2007", 4 pgs.
"U.S. Appl. No. 11/120,894, Non Final Office Action mailed Aug. 15, 2006", 5 pgs.
"U.S. Appl. No. 11/120,894, Response filed Apr. 12, 2007 to Final Office Action mailed Feb. 8, 2007", 13 pgs.
"U.S. Appl. No. 11/120,894, Response filed Aug. 13, 2007 to Non Final Office Action mailed May 15, 2007", 19 pgs.
"U.S. Appl. No. 11/120,894, Response filed Dec. 13, 2006 to Non Final Office Action mailed Aug. 15, 2006", 15 pgs.
"U.S. Appl. No. 11/120,894, Response filed Dec. 19, 2007 to Final Office Action mailed Oct. 19, 2007", 10 pgs.
"U.S. Appl. No. 11/120,894, Response filed Jun. 30, 2008 to Non-Final Office Action mailed Apr. 1, 2008", 9 pgs.
"U.S. Appl. No. 11/120,894, Final Office Action mailed Jul. 14, 2009", 11 Pgs.
"U.S. Appl. No. 11/120,894, Response filed May 11, 2009 to Non Final Office Action mailed Feb. 10, 2009", 11 pgs.
"U.S. Appl. No. 11/120,894, Response filed Oct. 29, 2009 to Final Office Action mailed Jul. 14, 2009", 12 pgs.
"U.S. Appl. No. 12/017,297, Non-Final Office Action mailed Mar. 31, 2009", 8 pgs.
"U.S. Appl. No. 12/017,297, Non-Final Office Action mailed Sep. 4, 2008", 7 pgs.
"U.S. Appl. No. 12/017,297, Response filed Dec. 4, 2008 to Non-Final Office Action mailed Sep. 4, 2008", 9 pgs.
"U.S. Appl. No. 12/017,297, Response filed Mar. 13, 2009 to Final Office Action mailed Jan. 13, 2009", 17 pgs.
"U.S. Appl. No. 12/017,297, Response filed Mar. 31, 2009 to Non-Final Office Action mailed Jan. 13, 2009", 8 pgs.
"U.S. Appl. No. 12/017,297, Final Office Action mailed Nov. 25, 2009", 8 pgs.
"U.S. Appl. No. 12/017,297, Final Office Action mailed Jan. 13, 2009", 9 pgs.
"U.S. Appl. No. 11/120,894, Final Office Action mailed May 24, 2010", 8 pgs.
"U.S. Appl. No. 11/120,894, Non-Final Office Action mailed Jan. 4, 2010", 9 pgs.
"U.S. Appl. No. 11/120,894, Non-Final Office Action mailed Jan. 28, 2010", 4 pgs.
"U.S. Appl. No. 11/120,894, Response filed Apr. 28, 2010 to Non Final Office Action mailed Jan. 28, 2010", 11 pgs.
"U.S. Appl. No. 12/017,297 Final Office Action mailed Aug. 3, 2010", 8 pgs.
"U.S. Appl. No. 12/017,297, Non-Final Office Action mailed Mar. 24, 2010", 7 pgs.
"U.S. Appl. No. 12/017,297, Response filed Feb. 25, 2010 to Final Office Action mailed Nov. 25, 2009", 10 pgs.
"U.S. Appl. No. 12/017,297, Response filed Jun. 23, 2010 to Non Final Office Action mailed Jun. 24, 2010", 9 pgs.
U.S. Appl. No. 11/120,894, Advisory Action mailed Jan. 9, 2009, 3 pgs.
U.S. Appl. No. 12/017,297, Response filed Jul. 30, 2009 to Non-Final Office Action mailed Mar. 31, 2009, 8 pgs.
U.S. Appl. No. 12/017,297, Response filed Dec. 4, 2008 to Non-Final Office Action mailed Sep. 4, 2008, 9 pgs.

* cited by examiner

… (1)

ANTI-CROSS-TALK CIRCUITRY FOR ROM ARRAYS

BACKGROUND

Reading or accessing of bit cells in read only memories (ROM) may result in cross talk due to surrounding bit-lines that may be discharged during the read operation. In sub-micron semiconductor technologies, large capacity and dense ROM arrays, bit-lines may have large capacitances. Distances between the bit-lines may be greatly reduced due to the density of the arrays. In these conditions, cross talk issues may occur. The cross talk may result in a zero being read instead of a one due to undesired discharge of the accessed bit-line.

As an example of such cross talk, consider a bit-cell set to one with a neighboring bit cell set to zero. A parasitic coupling capacitance exists between the two bit-lines. During the precharge of the bit-lines, just prior to reading the bit-cell, the bit-lines are set to one, corresponding to $V_{dd}$. During the reading, a word line rises to one. Then the bit-line to be read is supposed to stay at the precharge level of one since the bit-cell is one. The neighboring bit-line is discharged, since it has no charge, corresponding to a zero.

Due to cross talk, however, the bit-line to be read is partially discharged through the neighboring bit-line. This unwanted bit-line discharge, if large enough, may cause a sense amplifier to switch, such that a zero is read from the bit-line to be read instead of the one stored in the corresponding bit cell. This may occur even if the discharge of the bit-line to be read is not complete. If there are two neighbor bit-lines, both at zero, the discharge of the bit-line to be read may occur via parasitic capacitance coupling of both neighbor bit-lines.

In some ROM devices, the precharge stays active during reading through pull-up transistors that are always on. This avoids cross talk, since the bit-line to be read is driven to $V_{dd}$ during the reading. However, it results in additional power consumption that is not suitable for lower power applications. Static bit-line shields may be created by inserting vertical metal lines between adjacent columns to decrease parasitic capacitance by increasing distance between adjacent bit-lines. This approach consumes chip area and decreases the overall storage density achievable.

Some ROM devices implemented a dynamic bit-line shield such that during reading, all the unread bit-lines stay precharged to $V_{dd}$. Static current is important with such an architecture since bit-lines that are not read, stay driven to Vdd. Some low power ROMs may utilize high capacitive CMOS circuits to avoid cross talk. All the bit lines are discharged to zero before charge sharing. Such CMOS circuits decrease potential storage density, as a two extra bit lines are used for every 16 bit lines. Complex sensing circuitry may also be needed for such ROM. Half-swing circuitry is also not adapted for low voltage circuits.

In still further ROM, a content aware design framework may be used to reduce cross talk. The number of cells programmed to zero or one in each column may be modified to change the value of capacitance between two bit-lines. Such frameworks increase the complexity of reading circuitry, increase the area of the memory due to additional rows, and may not be totally efficient depending on ROM code.

In US Patent Application Publication No: 2006-0171240 to M. Combe, bit-lines of a memory device are arranged by an interleaving of even and odd bit-lines, and are segregated into an even and an odd bank. A discharge network discharges the banks alternately to reduce cross talk. One bank may be discharged just prior to selection of the other bank for reading. A discharge delay may be used to ensure that sense amplifiers do not detect signals during the discharge.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

A read only memory (ROM) device precharges a bit-line coupled to a bit cell to be read, and discharges at least one adjacent line to reduce cross talk between adjacent bit-lines. This occurs after the precharge when the bit cell is being read. Multiple embodiments are described including different circuits, and the discharge of multiple adjacent lines.

Figure 1:
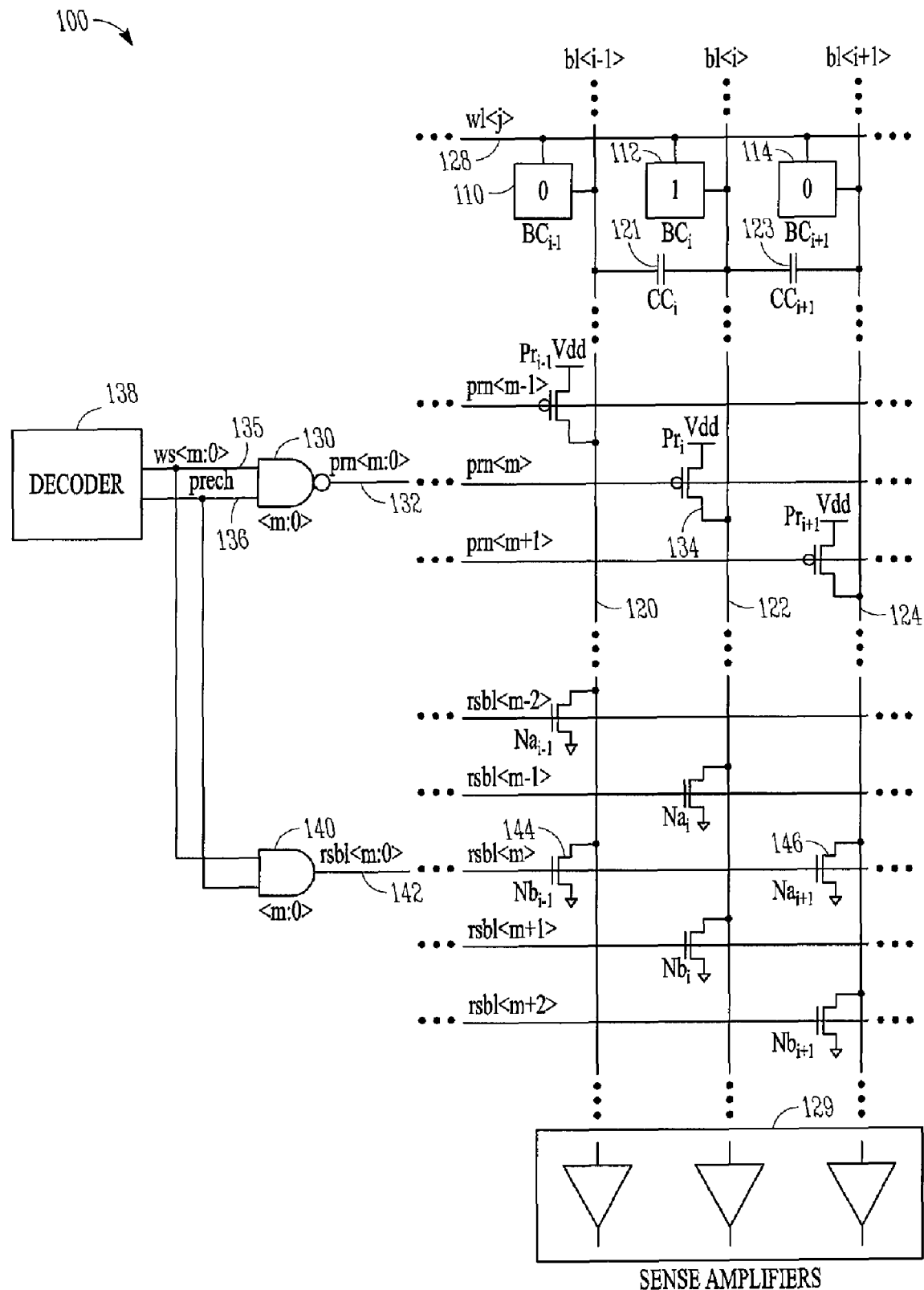
FIG. 1 is a circuit diagram of a read only memory array for discharging selected bit-lines of immediate neighborhood of bit-lines to be read during a precharge period according to an example embodiment.

FIG. 1 is a circuit diagram of a portion of a ROM array 100 having three bit cells 110, 112 and 114. In this embodiment, bit cell 112 represents a logical one. I.E. the cell will be read as a logical one during the reading. It means bit-line 122 will remain charged during the reading. Bit cells 110 and 114 represent a logical zero. I.E. the cells will be read as a logical zero during the reading. It means bit-lines 120 and 124 will be discharged during the reading.

Bit cells 110 and 114 are both adjacent or neighboring cells to bit cell 112, and for purposes of illustration, are have no charge, representing a logic zero. Each bit cell 110, 112 and 114 is coupled to respective bit-lines 120, 122 and 124, and to a word line 128. The bit-lines may be coupled to sense amplifier 129 to sense the charge on the bit-lines representative of the data stored in the bit cells. Parasitic capacitances between the adjacent bit-lines is indicated at 121 and 123. The adjacent bit-lines 120 and 124 may be said to be in the neighborhood of bit-line 122 due to such parasitic capacitance and the potential effect discharge of such lines may have on bit-line 122. Bit lines 120 and 124 are in a first order neighborhood as they are the closest bit-lines to bit line 122 which is to be used for reading the value in bit cell 112.

Precharge logic (NAND gate) 130 is shown for bit-line 122, and has an output 132 coupled to a precharge transistor 134. While a NAND gate is used, other types of logic gates may be used in various configurations to obtain suitable logic functions, such as OR gates or AND gates. Precharge transistor 134 is coupled to $V_{dd}$, and to bit-cell 112 to precharge bit-line 122 to $V_{dd}$ prior to read bit-line 122. The precharge logic 130 receives a word select signal 135 and a precharge signal 136 from column decoder circuitry 138. When precharge is enabled, precharge logic 130 provides a low signal on line 132 to PMOS precharge transistor 134, which pulls bit-line 122 to high or $V_{dd}$.

At the same time in this embodiment, word select signal 135 and precharge signal 136 from column decoder circuitry 138 are provided to a discharge logic (AND gate) 140. Discharge logic 140 has an output 142 coupled to discharge NMOS transistors 144 and 146, which are coupled to bit-cells 110 and 114 respectively. The discharge of transistors 144 and 146 operates to discharge the corresponding adjacent bit-lines during the precharge period. As illustrated by dots in FIG. 1, there may be many more sets of bit cells, bit-lines, logic elements and transistors coupled to the bit-lines to permit selective charging of a bit-line with concurrent discharge of adjacent bit-lines.

While transistors are shown and described in connection with the precharge and discharge transistors, other devices such as different circuit elements and amplifiers may be used in further embodiments to provide the switching function performed by the transistors.

Figure 2:
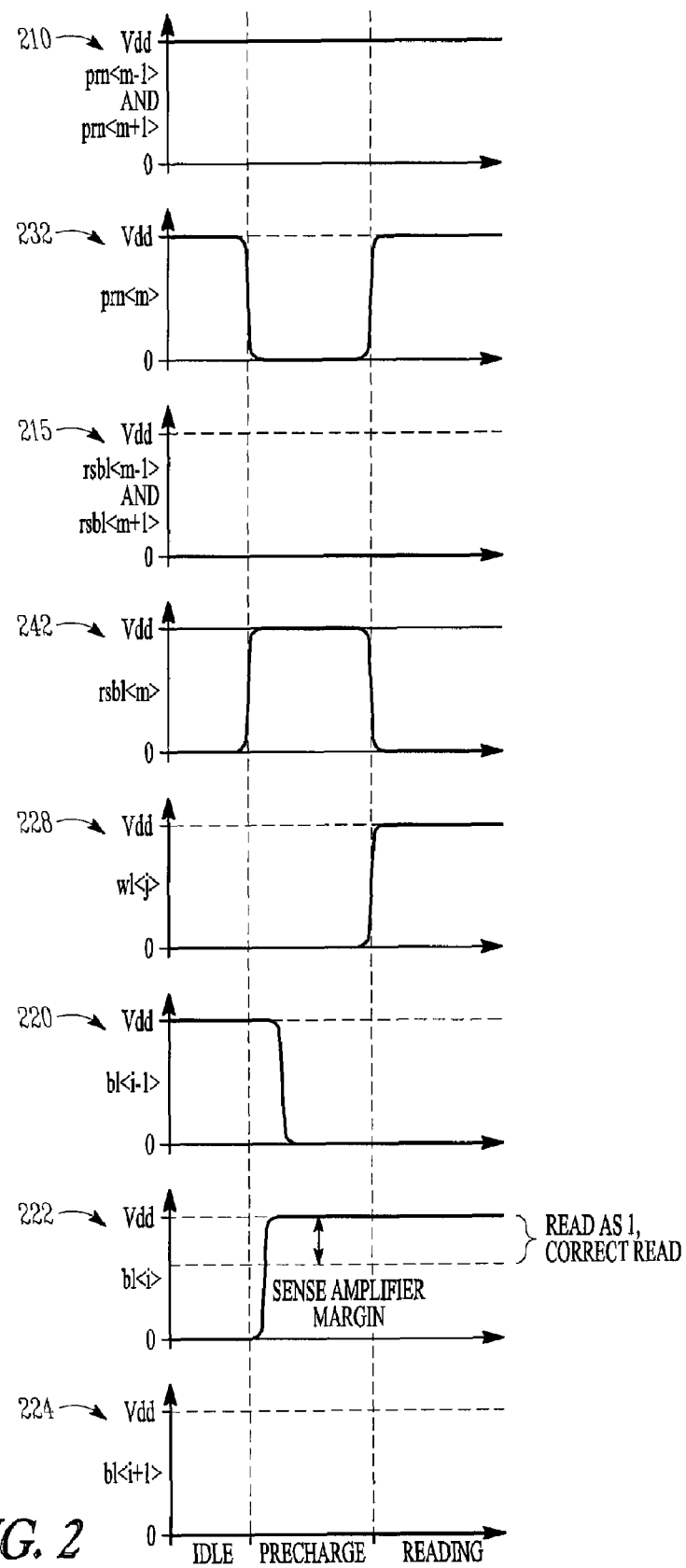
FIG. 2 is a waveform diagram illustrating selected waveforms from the circuit of FIG. 1 according to an example embodiment.

FIG. 2 is a timing diagram illustrating signals on several different lines of FIG. 1. The timing diagram is divided into three periods, idle, precharge and reading in chronological order. A waveform at 210 is representative of the signal to other precharge transistors corresponding to bit-lines that are not being read during the time illustrated in FIG. 2. Waveform 215 corresponds to the signals to other discharge transistors on other sets of bit-lines that are not both adjacent to the bit-line being read. The remaining waveforms in FIG. 2 have numbers that are one hundred higher than corresponding reference numbers in FIG. 1. Waveform 232 is representative of the signal on line 132, and is shown going low during the precharge period to cause bit-line 122 to be precharged via precharge transistor 134. Waveform 242 corresponding to the signal on line 142 is high during the precharge period, causing the discharge of bit-lines 120 and 124, as illustrated at waveforms 220 and 224. In one embodiment, it is assumed that bit-line 124 was already discharged due to a previous read cycle, as illustrated at waveform 224. If not, it would also be discharged during the precharge period. Other bit-lines may be floating since the associated precharge transistors and discharge transistors are off. When the precharge stops, only bit-line 122 is charged to $V_{dd}$, while the adjacent bit-lines are set to zero.

Word line 128 is raised to high during the reading period as indicated at waveform 228. Waveform 222, corresponding to bit-line 122 that is being read, was raised to $V_{dd}$ during the precharge period, and remains high during the reading period such that sense amplifier 129 senses that a one was stored in corresponding bit cell 112. Since both adjacent bit-lines 120 and 124 are already set to zero, there is no discharge of bit-line 122 through parasitic capacitances between adjacent lines. Bit-line 122 thus stays at $V_{dd}$. The cross talk between adjacent bit-lines has been reduced.

In some embodiments, ROM density may be increased because there is no need for additional bit-lines or rows in the memory array. There is also no static current path between supply rails since precharge is cut during reading. Full swing circuitry is adapted to low-voltage circuits. There may be reduced leakage when the memory is idle due to stack effect on the bit-lines. Further, dynamic power may be reduced since only the bit-lines to be read are precharged. Any type of sensing circuitry may be used to sense the bit-lines.

Figure 3:
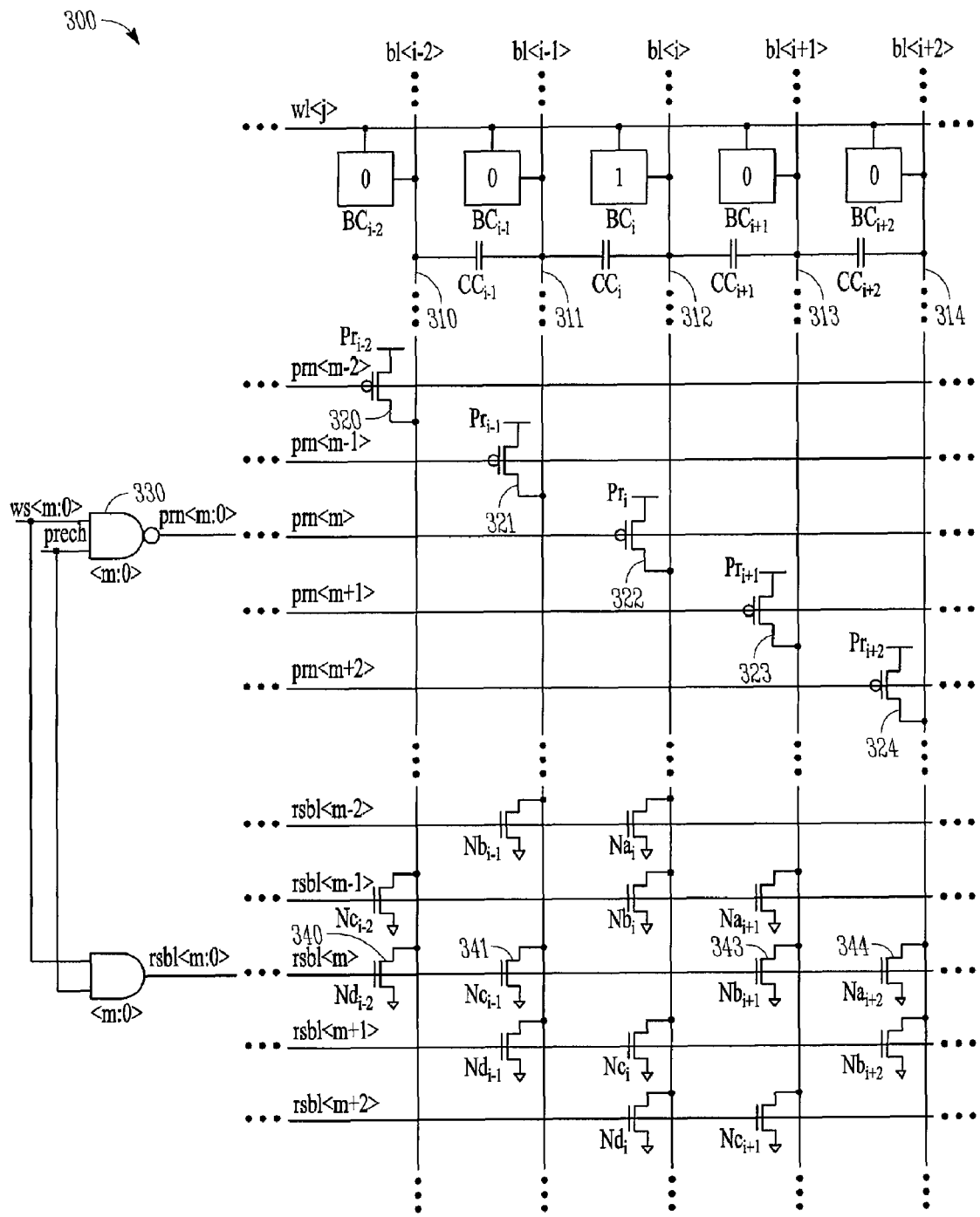
FIG. 3 is a circuit diagram of an alternative read only memory array for discharging selected bit-lines of a second order neighborhood of bit-lines to be read during a precharge period according to an example embodiment.

In a further embodiment illustrated in circuit 300 in FIG. 3, neighboring bit-lines at the first order, as well as selected further second order bit-lines may be discharged during the precharge of a desired bit-line. In circuit 300, five bit-lines 310, 311, 312, 313, and 314 are shown with corresponding precharge transistors 320, 321, 322, 323 and 324. Logic 330 for controlling precharge transistors and discharge transistors is illustrated with respect to the reading of bit-line 312. Precharge transistor 322, coupled to bit-line 312, precharges bit-line 312 to $V_{dd}$. During the precharge period, four discharge transistors 340, 341, 343 and 344 are shown coupled to bit-lines 310, 311, 313 and 314 respectively to pull them down to zero or discharge them. In this example, bit-lines 311 and 313 are immediately adjacent bit-line 312, which is being read, and may be referred to as first order neighborhood bit-lines. Following bit-lines 310 and 314 (neighboring at the second order) are also discharged. This may be beneficial as circuit densities increase, and bit-lines become closer and closer together, further increasing parasitic capacitance between them and the potential for adverse consequences from cross talk.

Figure 4:
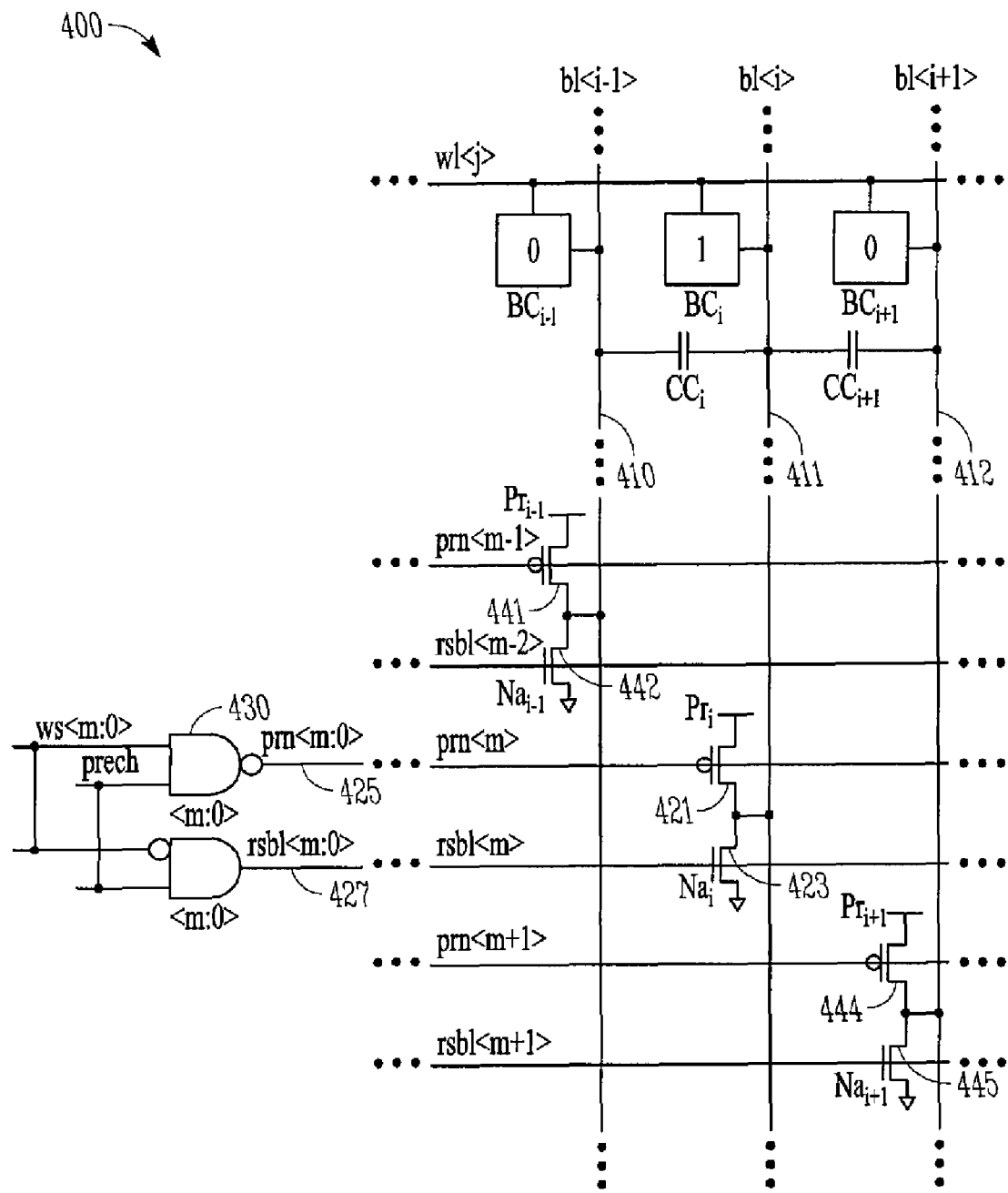
FIG. 4 is a circuit diagram of a further alternative read only memory array for discharging all selected un-read bit-lines during a precharge period according to an example embodiment.

FIG. 4 illustrates a circuit 400 that discharges all unread bit-lines that are not being read. Three bit-lines 410, 411 and 412 are illustrated, and are each coupled to sets of precharge and discharge transistors, as illustrated for bit-line 411, the bit-line to be read in this example by precharge transistor 421 and discharge transistor 423. Logic 430 controls the transistors 421, 423 by corresponding control lines 425, 427, using the same word select signals from the decoder. When precharge is enabled, bit-line 411 is pulled up to $V_{dd}$ by precharge transistor 421. When precharge is disabled, bit-lines are pulled down to zero by transistor 423. Since the logic 430 and transistors 421, 423 are duplicated for each bit-line to be read, all other bit-lines not being read are discharged when one bit-line is being read. In this example circuit 400, bit-line 410 has a precharge transistor 441 and discharge transistor 442, and bit-line 412 has a precharge transistor 444 and discharge transistor 445.

Figure 5:
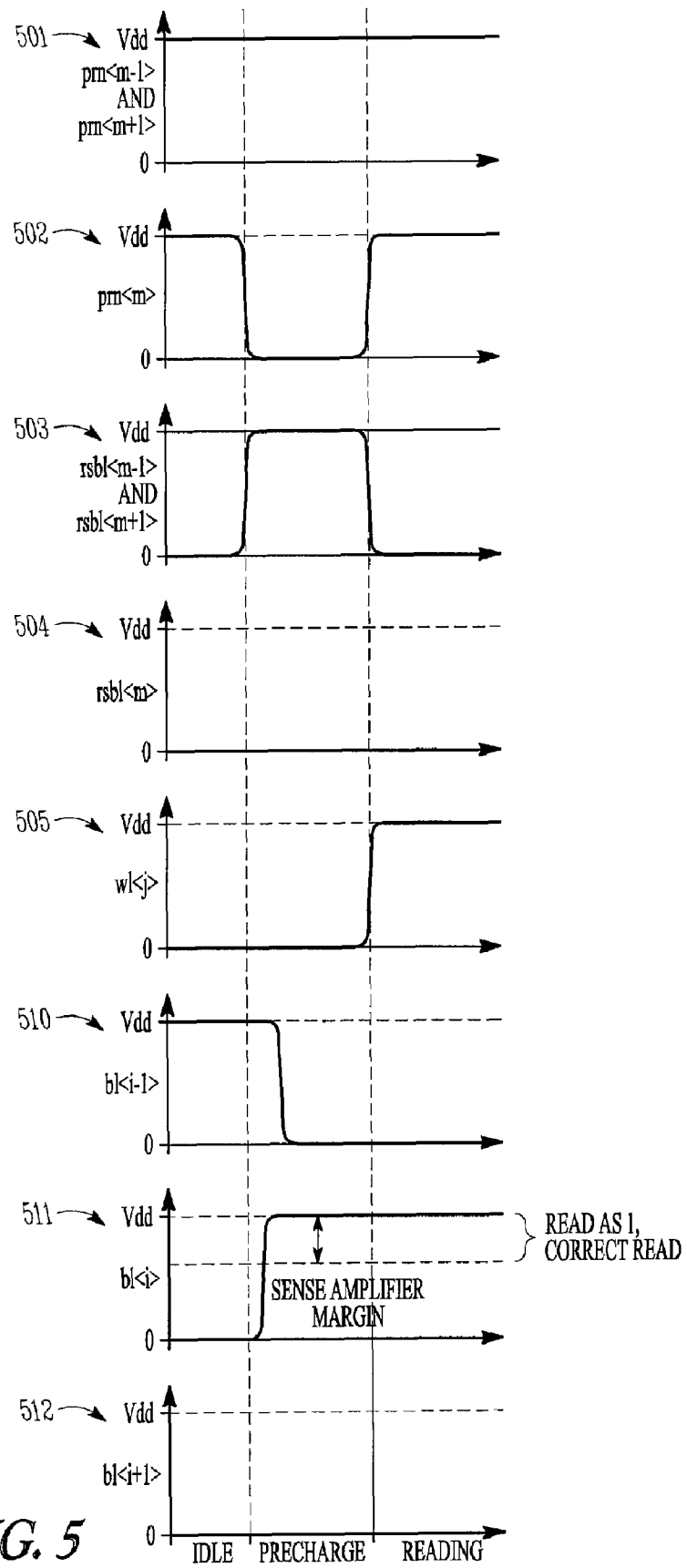
FIG. 5 is a waveform diagram illustrating selected waveforms from the circuit of FIG. 4 according to an example embodiment.

FIG. 5 illustrates waveforms for circuit 400. In this example, bit-line 411 is being read. Because of circuit 400, only one of the two adjacent bit-lines, 410 has been precharged and stated to $V_{dd}$ from a previous access as illustrated at 510. Bit-line 412 is high as shown in waveform 512. The bit-line 411 to be precharged in preparation for reading is active low at the beginning of the precharge as illustrated at 511. When precharge starts, precharge transistor 421 is turned on as illustrated at waveform 502 and discharge transistor 423 is turned off via waveform 504, resulting in bit-line 411 being charged to $V_{dd}$. At the same time, signals 501 to precharge transistors 441 and 444 on bit-lines 410 and 412 ensure that they are off. Signals 503 to discharge transistors 442 and 445 ensure that they are one, causing discharge of the adjacent bit-lines 410 and 412. When the precharge stops, only bit-line 411 is at $V_{dd}$, while the adjacent bit-lines are set to zero.

When reading starts, the word line is enabled via waveform 505. Since both adjacent bit-lines 410 and 412 are already set to zero, there is little if any un-wanted discharge of bit-line 411. Bit-line 411 thus stays near $V_{dd}$ as desired. Circuit 400 makes the cross talk parasitic capacitances ineffective. Since the voltage on bit-line 411 stays high, it is above the sense amplifier margin and the sensed value is correct.

Figure 6:
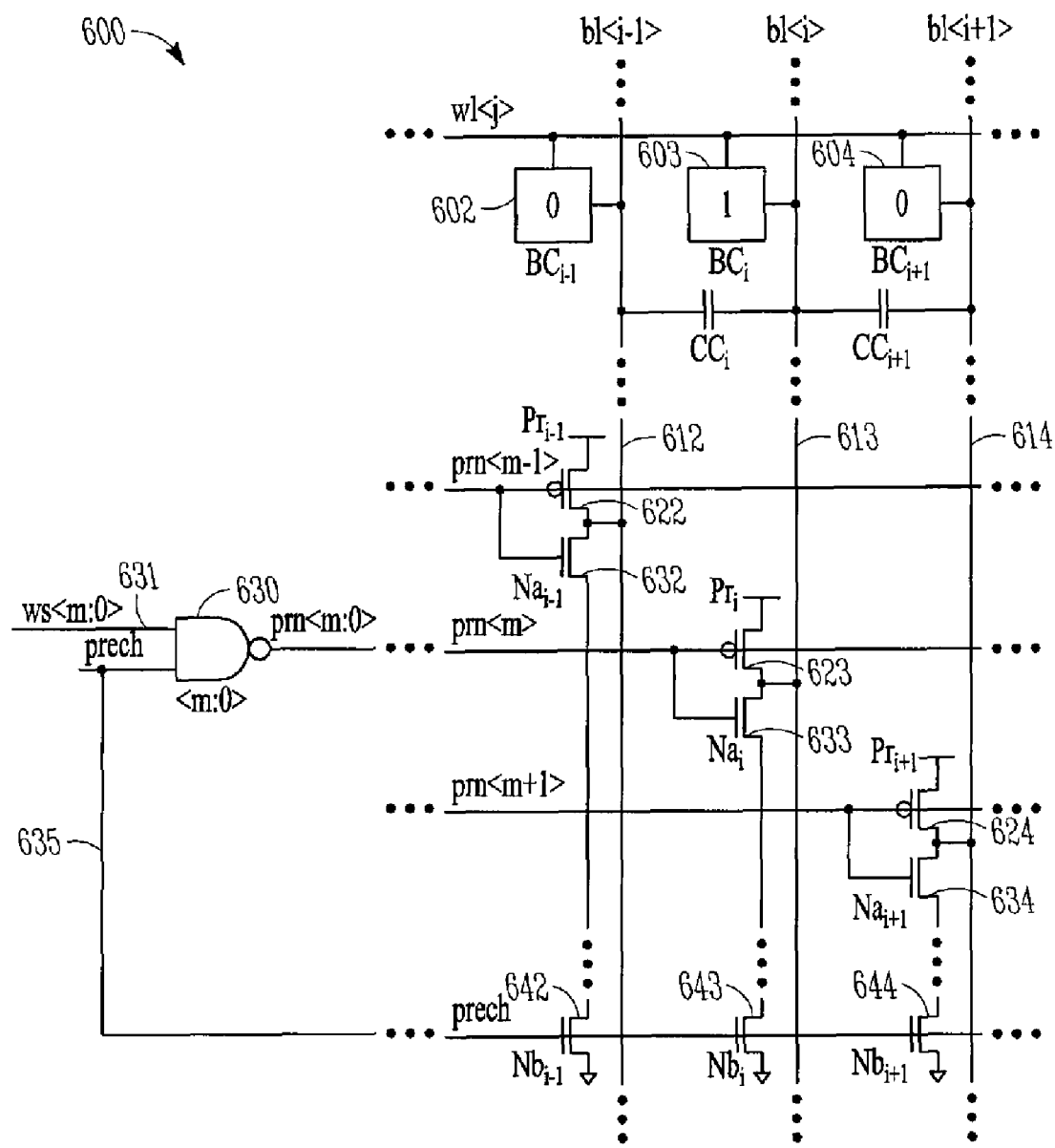
FIG. 6 is a circuit diagram of still further alternative, with a reduced number of signals and transistors of a read only memory array for discharging all selected un-read bit-lines during a precharge period according to an example embodiment.

FIG. 6 illustrates a further alternative embodiment of a circuit 600 that may result in an increase in memory density. The number of signals to command precharge and discharge transistors may be cut in half by use of circuit 600 in one embodiment. Three bit cells 602, 603 and 604 are coupled to corresponding bit-lines 612, 613 and 614. Each bit-line 612, 613 and 614 has a corresponding PMOS precharge transistor 623 and pair of NMOS discharge transistors 633 and 643. Precharge transistor 623 and discharge transistors 633 and 643 correspond to bit-line 613. Each of the other bit-lines has a similar set of transistors as illustrated. Bit line 612 has a precharge transistor 622, and discharge transistors 632 and 642. Bit line 614 has a precharge transistor 624, and discharge transistors 634 and 644.

In one embodiment, the inputs of PMOS precharge transistor 623 and discharge transistor 633 are coupled to an output from precharge logic 630. Input to precharge logic 630 includes a word select line 631 and a precharge line 635. The precharge line is also coupled to each of the discharge transistors 643 for each bit-line via the use of a single control line 635 that provides the same precharge signal provided to the precharge logic 630. When precharge is enabled for one bit-line, such as bit-line 613, the bit-line is pulled up to $V_{dd}$ by PMOS transistor 623. The NMOS transistor 633 is off, and the path to ground via transistor 643 is cut. For other bit-lines, during precharge, transistors 622 and 624 are off and, 632 and 634 are on as well as all other precharge and discharge transistors. The precharge signal is high on line 635, turning on discharge transistors, 642 and 644, as well as all other discharge transistors. For the non-selected bit-lines, transistors 632, 642 and 634, 644 respectively, provide a path to ground, pulling down the lines to zero.

Figure 7:
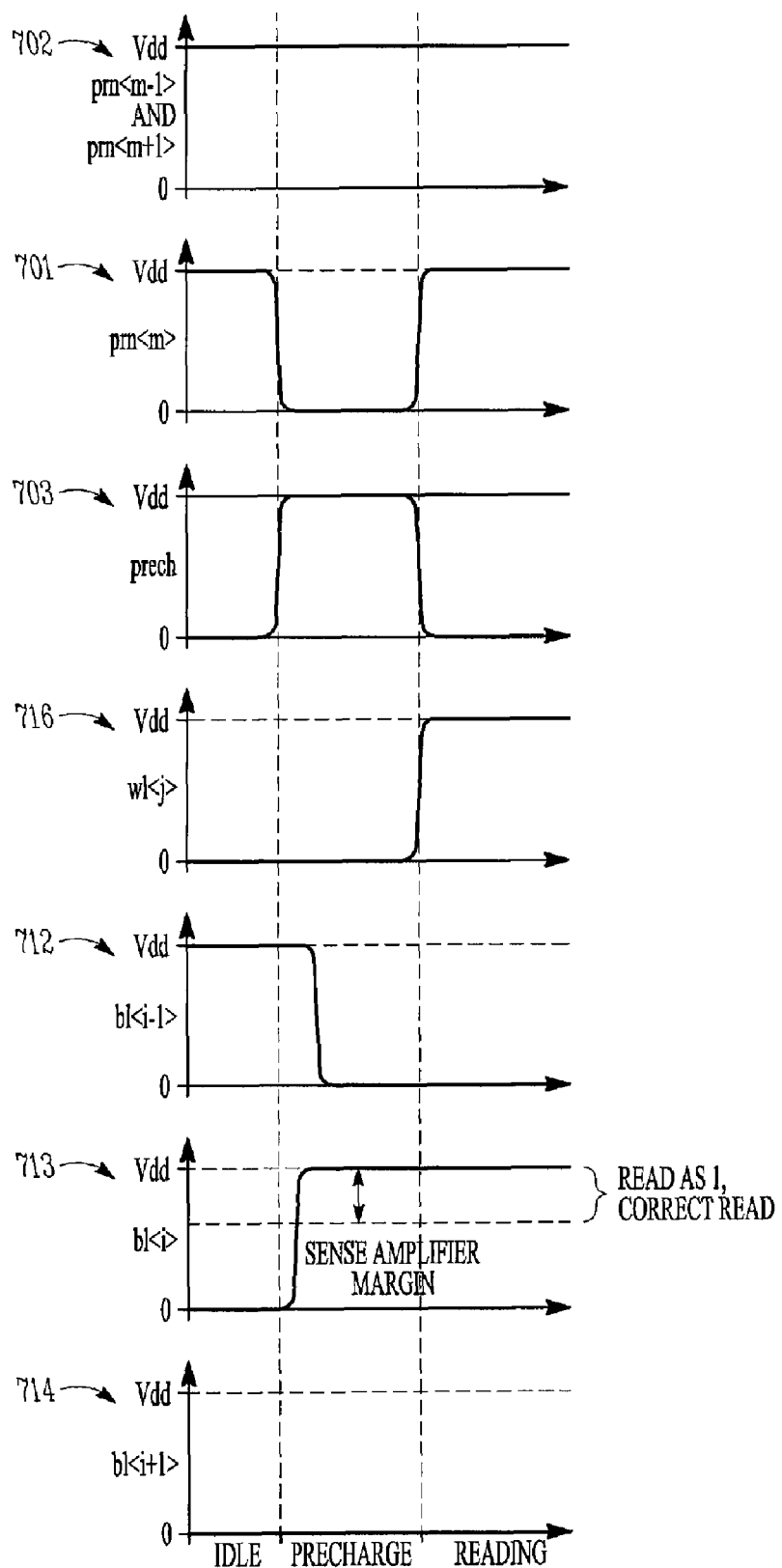
FIG. 7 is a waveform diagram illustrating selected waveforms from the circuit of FIG. 6 according to an example embodiment.

FIG. 7 illustrates waveforms associated with circuit 600. In one embodiment, use of circuit 600 results in only one of the two adjacent bit-lines 612 and 614 being precharged, and staying at $V_{dd}$ from a previous access. In this embodiment, it is assumed that bit-line 612 is at $V_{dd}$ as illustrated in waveform 712. Bit-line 612 is represented by waveform 712 and bit-line 614 is represented by waveform 714. When the precharge starts, the signal from logic 630 is active low, at 701, causing precharge transistor 623 to be on, and discharge transistor 633 on bit-line 613 to be off.

Also during precharge, the signal provided to the other precharge transistors is high, at 702, resulting in the other precharge transistors being off, and their discharge transistors being on. Since precharge is also high, at 703, the discharge transistors coupled to ground such as transistors 642 & 644 are also on, providing a discharge path to ground. Thus, bit-line 612 is discharged to ground as indicated by waveform 712. When the precharge stops, only bit-line 613 is charged to $V_{dd}$, with all the other bit-lines downed to zero.

When reading starts, the word line is enabled at 716. Since both adjacent bit-lines are already set to zero, there is no un-wanted discharge of bit-line 613, and it stays at $V_{dd}$ as desired.

Figure 8:
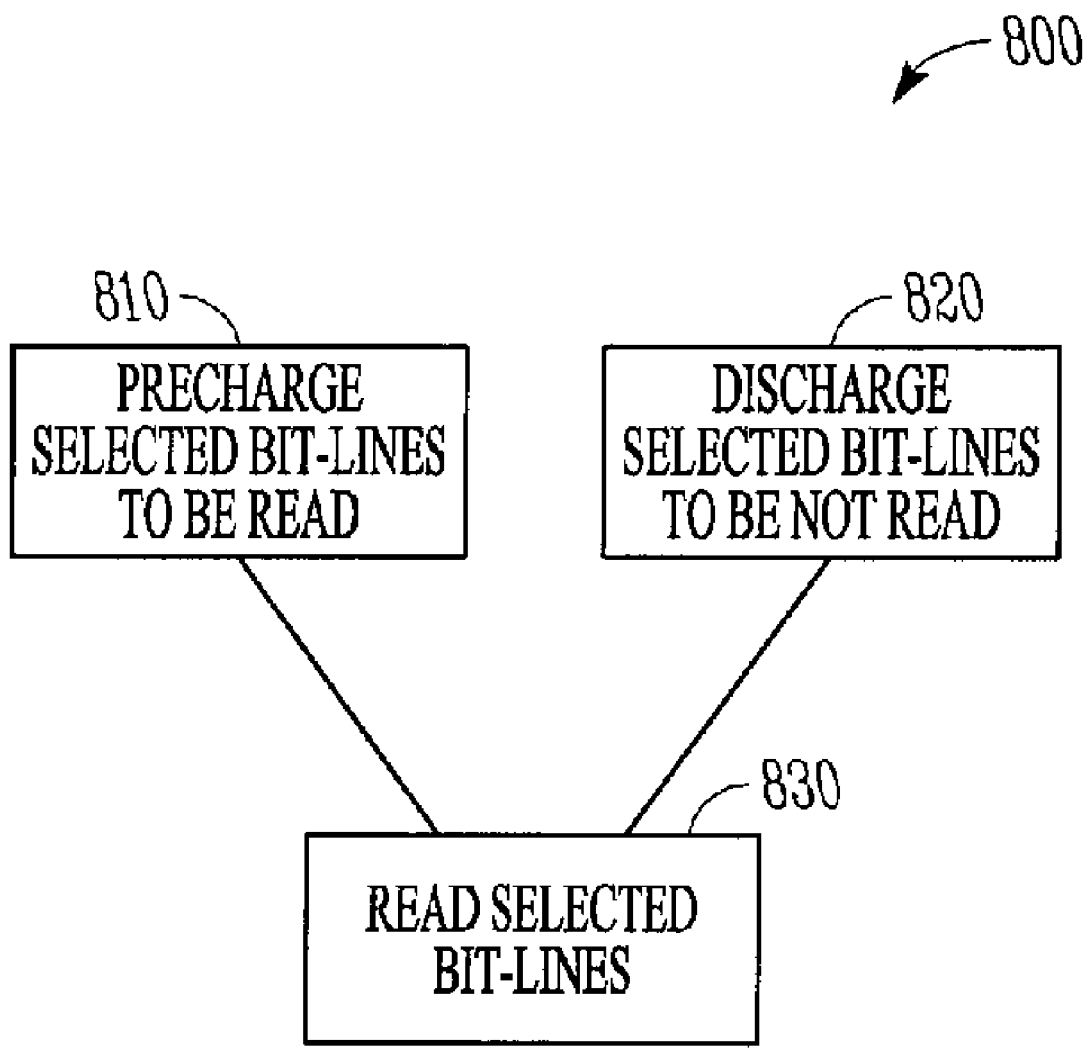
FIG. 8 is a flow diagram illustrating a method of reading a read only memory (ROM) according to an example embodiment.

FIG. 8 is a flow diagram illustrating a method 800 of reading data from a bit cell in a ROM array. In one embodiment, method 800 includes precharging a selected bit-line at 810 in a read only memory (ROM) array during a precharge period of the read cycle. At 820, at least one bit-line adjacent to the selected bit-line is discharged during the precharge period. In one embodiment, the precharging at 810 and discharging at 820 are done simultaneously, but may also be done any time during a precharge period. At 830, after the precharge period, the selected bit-line is read such that parasitic capacitance effects on the selected bit-line are reduced. In a further embodiment, both bit-lines adjacent to the selected bit-line are discharged during the precharge period at 820. In one embodiment, two bit-lines on both sides of the selected bit-line are discharged during the precharge period at 820. In a still further embodiment, all bit-lines coupled to a word line, other than the selected bit-line coupled to the word line are discharged during the precharge period at 820.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A read only memory (ROM) circuit comprising:
a plurality of bit cells;
a plurality of bit-lines, each of the plurality of bit-lines being coupled to a respective one of the plurality of bit cells;
a precharge device coupled to a selected one of the bit-lines;
a discharge device coupled to an adjacent one of the bit-lines arranged adjacent to the selected one of the bit-lines;
a logic device coupled to the precharge device and the discharge device, the logic device being operable to cause the discharge device to discharge the adjacent bit-line and to cause the precharge device to pre-charge the selected bit-line prior to reading the selected bit-line and
decode circuitry coupled to the logic device and operable to provide a word select signal and a precharge signal to the logic device, the precharge signal being operable to control the logic device.

2. The circuit of claim 1 wherein the selected bit-line corresponding to the bit cell selected for reading is pre-charged by the precharge device under control of the logic device for all or a portion of a precharge period of a read cycle, and the adjacent bit-line adjacent to the selected bit-line is discharged by the discharge device under control of the logic device for all or a portion of the precharge period.

3. The circuit of claim 2 wherein there are at least two adjacent ones of the bit-lines arranged adjacent to the selected bit-line, and wherein both of the adjacent bit-lines are discharged for all or a portion of the precharge period.

4. The circuit of claim 1 wherein the logic device comprises a gate having an output coupled to the precharge device.

5. The circuit of claim 4 wherein the logic device further comprises an AND gate having an output coupled to the discharge device or one or more other discharge devices coupled to the adjacent bit-line or one or more other adjacent ones of the bit-lines adjacent to the selected bit-line.

6. The circuit of claim 5 wherein the precharge device comprises a PMOS transistor and wherein the discharge device and the one or more other discharge devices each comprise an NMOS transistor.

7. A circuit comprising:
a plurality of bit cells that collectively form at least a portion of a memory array, each bit cell having:
a respective bit-line coupled to the bit cell;

a precharge device coupled to the respective bit-line;
a discharge device coupled to the respective bit-line;
a logic device coupled to the precharge device and the discharge device, the logic device being operable to cause the precharge device to precharge the respective bit-line when the bit cell is selected for reading, and operable to cause the discharge device to discharge the respective bit-line when an adjacent one of the bit cells having a corresponding adjacent bit-line is selected for reading; and
decode circuitry coupled to the logic device and operable to provide a word select signal and a precharge signal to the logic device, the precharge signal being operable to control the logic device.

8. The circuit of claim 7 wherein the bit-line of the bit cell selected for reading is pre-charged by the precharge device under control of the logic device for all or a portion of a precharge period of a read cycle, and the adjacent bit-line adjacent to the bit-line of the bit cell selected for reading is discharged by the discharge device under control of the logic device for all or a portion of the precharge period.

9. The circuit of claim 8 wherein there are at least two adjacent bit-lines adjacent to the bit-line of the bit cell selected for reading, and wherein both of the adjacent bit-lines are discharged for all or a portion of the precharge period.

10. The circuit of claim 7 wherein the logic device comprises a gate having an output coupled to the precharge device.

11. The circuit of claim 10 wherein the logic device further comprises an AND gate having an output coupled to the discharge device or one or more other discharge devices coupled to the adjacent bit-line or one or more other adjacent ones of the bit-lines adjacent to the bit-line of the selected bit cell.

12. The circuit of claim 11 wherein the precharge device comprises a PMOS transistor and wherein the discharge device and the one or more other discharge devices each comprise an NMOS transistor.

13. The circuit of claim 9 wherein the at least two adjacent bit-lines, one on either side of the bit-line corresponding to the selected bit cell, each have corresponding discharge devices in an operative state discharging the respective adjacent bit-lines when the precharge device coupled to the bit-line corresponding to the selected bit cell is also in an operative state pre-charging the respective bit-line.

14. A circuit comprising:
a plurality of bit cells that collectively form at least a portion of a memory array, each bit cell having:
a respective bit-line coupled to the bit cell;
a precharge device coupled to the respective bit-line;
a first discharge device coupled to the respective bit-line;
a logic device coupled to the precharge device and the first discharge device, the logic device being operable to cause the precharge device to precharge the respective bit-line when the bit cell is selected for reading, and operable to cause the discharge device to discharge the respective bit-line during a precharge period when a different bit cell of the plurality of bit cells is selected for reading; and
decode circuitry coupled to the logic device and operable to provide a word select signal and a precharge signal to the logic device, the precharge signal being operable to control the logic device.

15. The circuit of claim 14 further comprising a second discharge device coupled in series with the first discharge device, the first discharge device being operable to turn on the second discharge device during the precharge period.

16. The circuit of claim 15 wherein the precharge device comprises a PMOS transistor and wherein the first discharge device comprises an NMOS transistor, and wherein a gate input of the PMOS transistor and a gate input of the NMOS transistor are electrically connected to one another.

17. The circuit of claim 15 wherein the second discharge device comprises an NMOS transistor having a gate input coupled to a precharge signal that is also provided to the control logic.

18. A method comprising:
precharging a selected bit-line in a read only memory (ROM) array during a precharge period of a read cycle during which read cycle a selected bit cell of the ROM array coupled to the selected bit-line is read;
discharging at least one bit-line adjacent to the selected bit-line during the precharge period; and
after the precharge period, reading the selected bit-line, wherein during the reading, parasitic capacitance effects on the selected bit-line are substantially reduced as a result of minimizing the parasitic capacitance between the selected bit-line and the at least one adjacent bit-line.

19. The method of claim 18 wherein the at least one bit-line adjacent to the selected bit-line comprises two first-order immediately adjacent neighboring bit-lines adjacent to the selected bit-line, and wherein both of the two adjacent bit-lines are discharged during the precharge period.

20. The method of claim 19 wherein in addition to the first-order immediately adjacent bit-line on each side of the selected bit-line, there is at least one second-order bit-line adjacent to the respective first-order bit-line, the second-order bit-line on each side of the selected bit-line being separated from the selected bit-line by the respective first-order bit-line, and wherein the two first-order bit-lines and the at least two second-order bit-lines are discharged during the precharge period.

21. The method of claim 18 wherein all bit-lines coupled to a word line, other than the selected bit-line coupled to the word line, are discharged during the precharge period.

* * * * *